(12) United States Patent
Shi et al.

(10) Patent No.: US 12,374,857 B2
(45) Date of Patent: Jul. 29, 2025

(54) OPTICAL ASSEMBLY WITH A MICROLENS COMPONENT AND CONTACTS ON A SAME SURFACE OF A VERTICAL CAVITY SURFACE EMITTING LASER DEVICE

(71) Applicant: Lumentum Operations LLC, San Jose, CA (US)

(72) Inventors: Wei Shi, San Jose, CA (US); Kevin Wang, Fremont, CA (US); Hao Huang, San Jose, CA (US); John Michael Miller, Ottawa (CA); Siu Kwan Cheung, San Jose, CA (US); Lijun Zhu, Pleasanton, CA (US)

(73) Assignee: Lumentum Operations LLC, San Jose, CA (US)

(*) Notice: Subject to any disclaimer, the term of this patent is extended or adjusted under 35 U.S.C. 154(b) by 885 days.

(21) Appl. No.: 17/449,386

(22) Filed: Sep. 29, 2021

(65) Prior Publication Data

US 2023/0027279 A1    Jan. 26, 2023

Related U.S. Application Data

(60) Provisional application No. 63/225,769, filed on Jul. 26, 2021.

(51) Int. Cl.
| | |
|---|---|
| *H01S 5/00* | (2006.01) |
| *H01S 5/02253* | (2021.01) |
| *H01S 5/02345* | (2021.01) |
| *H01S 5/0239* | (2021.01) |
| *H01S 5/024* | (2006.01) |

(Continued)

(52) U.S. Cl.
CPC ........ *H01S 5/0239* (2021.01); *H01S 5/02253* (2021.01); *H01S 5/02345* (2021.01); *H01S 5/02469* (2013.01); *H01S 5/0261* (2013.01); *H01S 5/18388* (2013.01); *H01S 5/423* (2013.01); *H01L 24/00* (2013.01); *H01S 5/02208* (2013.01); *H01S 5/02257* (2021.01); *H01S 5/06825* (2013.01)

(58) Field of Classification Search
CPC .............. H01S 5/0239; H01S 5/02253; H01S 5/02345; H01S 5/02469; H01S 5/0261; H01S 5/18388; H01S 5/423; H01S 5/02208; H01S 5/02257; H01S 5/06825
See application file for complete search history.

(56) References Cited

U.S. PATENT DOCUMENTS

| | | | |
|---|---|---|---|
| 2003/0194168 A1* | 10/2003 | Ouchi | .................... G11B 7/123 |
| 2008/0232412 A1* | 9/2008 | Mizuuchi | ............ H01S 5/18386 |
| | | | 372/22 |

(Continued)

*Primary Examiner* — Kinam Park
(74) *Attorney, Agent, or Firm* — Harrity & Harrity, LLP

(57) ABSTRACT

In some implementations, an optical assembly includes a substrate that includes a thermally conductive core, an IC driver chip that is disposed on a first surface of the substrate, and a VCSEL device that includes an electrically insulated surface that is disposed on the thermally conductive core of the substrate within a cavity formed in the second surface of the substrate. The VCSEL device includes a cathode contact disposed on a surface of the VCSEL device and an anode contact disposed on the surface of the VCSEL device. The VCSEL device includes a plurality of emitters and a microlens component that is disposed over the plurality of emitters on the surface of the VCSEL device.

20 Claims, 4 Drawing Sheets

(51) Int. Cl.
  *H01S 5/026*   (2006.01)
  *H01S 5/183*   (2006.01)
  *H01S 5/42*    (2006.01)
  *H01L 23/00*       (2006.01)
  *H01S 5/02208*     (2021.01)
  *H01S 5/02257*     (2021.01)
  *H01S 5/068*       (2006.01)

(56) References Cited

U.S. PATENT DOCUMENTS

| | | | | |
|---|---|---|---|---|
| 2013/0163627 A1* | 6/2013 | Seurin | ................ | H01S 5/02345 |
| | | | | 372/36 |
| 2020/0343695 A1* | 10/2020 | Mathai | ................ | H01S 5/02345 |
| 2021/0098964 A1* | 4/2021 | Kim | ........................ | H01S 5/022 |
| 2021/0267043 A1* | 8/2021 | Yoo | ..................... | H01L 23/3677 |
| 2022/0236381 A1* | 7/2022 | Steinmann | ............ | H01L 31/167 |
| 2023/0008483 A1* | 1/2023 | Watanabe | ........... | H01S 5/18377 |
| 2023/0026423 A1* | 1/2023 | Raabe | .................. | H01S 5/0234 |

\* cited by examiner

US 12,374,857 B2

OPTICAL ASSEMBLY WITH A MICROLENS COMPONENT AND CONTACTS ON A SAME SURFACE OF A VERTICAL CAVITY SURFACE EMITTING LASER DEVICE

RELATED APPLICATION

This application claims priority to U.S. Provisional Patent Application No. 63/225,769, for "VERTICAL CAVITY SURFACE EMITTING LASER CHIP WITH ELECTRODES AND MICROLENS ON A SAME SIDE AS EMITTERS," filed on Jul. 26, 2021, the content of which is incorporated by reference herein in its entirety.

TECHNICAL FIELD

The present disclosure relates generally to an optical assembly and to an optical assembly with a microlens component and contacts on a same surface of a vertical cavity surface emitting laser (VCSEL) device.

BACKGROUND

Time-of-flight (ToF) systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses.

SUMMARY

In some implementations, an optical subassembly includes a substrate; an integrated circuit (IC) driver chip that is disposed on a first surface of the substrate; and a VCSEL device that is disposed on a second surface of the substrate, wherein the VCSEL device includes: a substructure, a plurality of emitters disposed within the substructure of the VCSEL device, a microlens component disposed over the plurality of emitters and on a particular surface of the substructure of the VCSEL device, a cathode contact disposed on the particular surface of the substructure of the VCSEL device, and an anode contact disposed on the particular surface of the substructure of the VCSEL device.

In some implementations, an optical assembly includes a substrate that includes a thermally conductive core; an IC driver chip that is disposed on a first surface of the substrate; and a VCSEL device that is disposed on a second surface of the substrate, wherein the VCSEL device includes: a cathode contact disposed on a surface of the VCSEL device, and an anode contact disposed on the surface of the VCSEL device.

In some implementations, an optical assembly includes a substrate that includes a thermally conductive core; an IC driver chip that is disposed on a first surface of the substrate; and a VCSEL device that includes an electrically insulated surface that is disposed on the thermally conductive core of the substrate within a cavity formed in a second surface of the substrate.

DETAILED DESCRIPTION

Figure 1A:
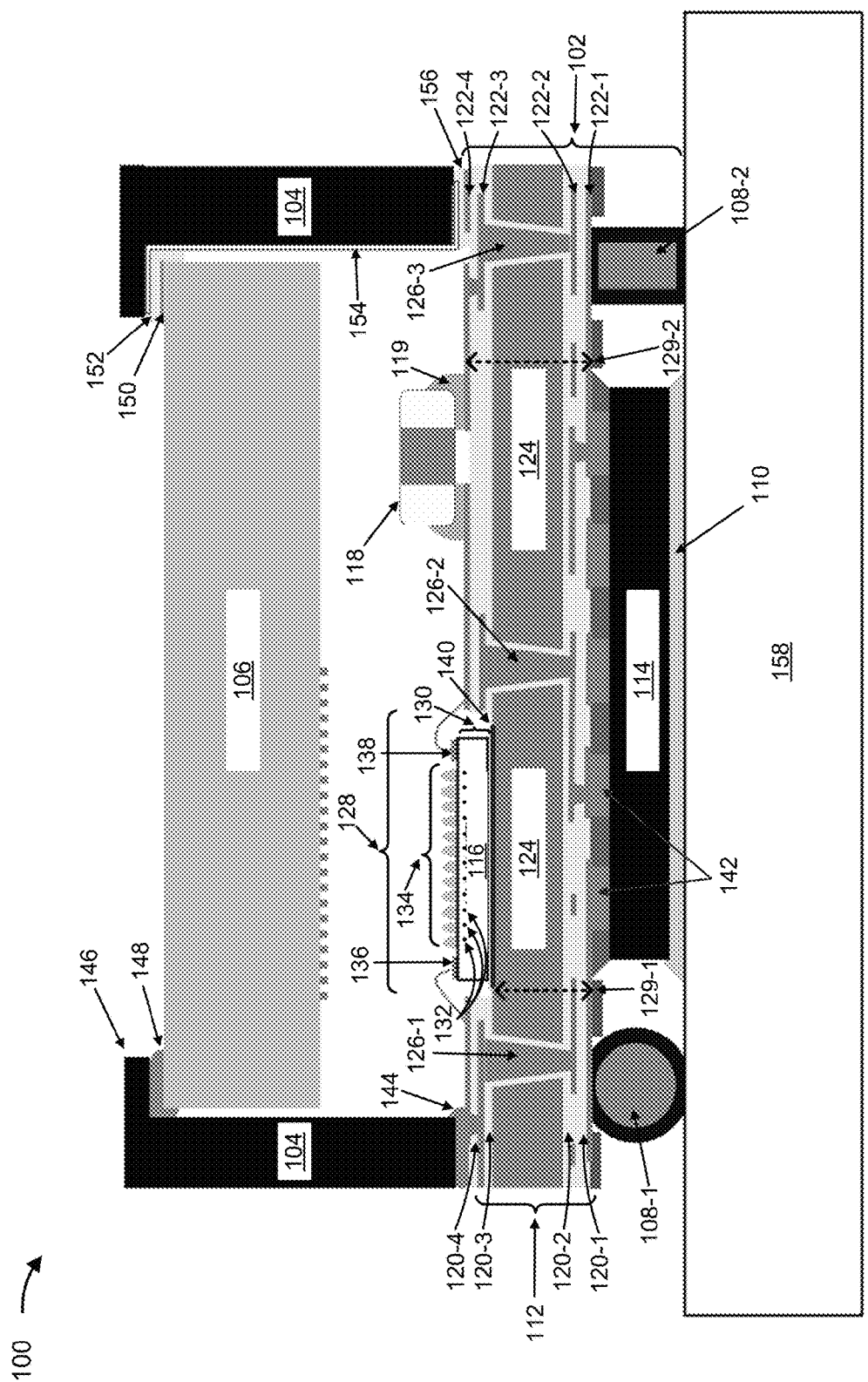
FIGS. 1A-1C are diagrams of an example optical assembly described herein.

The following detailed description of example implementations refers to the accompanying drawings. The same reference numbers in different drawings may identify the same or similar elements.

A conventional projector module can be used for a three-dimensional (3D) sensing application, such as a time-of-flight (TOF) application. The conventional projector module may include an emitter array (e.g., a VCSEL array), a lens, a diffractive optical element (DOE), and an IC driver chip. In operation, the IC driver chip provides an electrical signal to cause the emitter array to emit light (e.g., infrared (IR) light), which is collimated by the lens, and beams of collimated light (each corresponding to a respective emitter) are directed to the DOE. The DOE distributes the collimated beams of light to create a dot projection (e.g., a projection of the collimated beams) on a subject. More specifically, the DOE diffracts a given beam of light such that diffracted orders of the given beam are transmitted by the DOE at different angles. The conventional projector module may include one or more additional elements (e.g., one or more sensors, processors, and/or the like) to sense the dot projection and make one or more measurements concerning the subject based on the dot projection.

Typically, the emitter array and the IC driver chip are disposed on a surface of a substrate (e.g., a flame retardant (FR) substrate, such as an FR4 substrate, or a high temperature co-fired ceramic (HTCC) substrate) of the conventional projector module (e.g., a top surface of the substrate). However, the IC driver chip occupies a large region of the surface of the substrate, which increases a size of the substrate and therefore increases a size (e.g., an XY footprint) of the conventional projector module. Moreover, a conventional projector module often includes a photodiode (PD) that can detect an in-field failure of the lens or another optical element (e.g., when the lens is broken or has fallen off a housing of the conventional projector module). When the PD detects an in-field failure, the IC driver chip shuts down the emitter array of the conventional projector module (e.g., to prevent further emission of light by the emitter array for eye safety compliance). However, inclusion of the PD in the conventional projector module further increases the size (e.g., the XY footprint) of the conventional projector module. Additionally, the inclusion of both a lens and a DOE in the conventional projector model increases a thickness (e.g., a Z height) of the conventional projector module. Thus, the size and height of a conventional projector model prevents the conventional projector module from being included in some user devices, such as smart phones.

Moreover, in a convention projector module, the emitter array includes a cathode on a bottom surface of the emitter array, which is disposed on the surface of the substrate. The cathode functions as an electrical current path and a heat dissipation path, and therefore requires multiple layers of dielectric material to be included in the substrate. This impedes a thermal conductivity of the substrate. Consequently, the conventional projector module suffers from a high thermal resistance that decreases an optical power output of the conventional projector module (e.g., due to a high emitter junction temperature associated with the emitter array of the conventional projector module).

Some implementations described herein provide an optical assembly for an electro-optical device, such as a ToF device. The optical assembly may include a substrate that includes a thermally conductive core, an IC driver chip that is disposed on a first surface of the substrate, and a VCSEL device that is disposed on a second surface of the substrate (e.g., in a vertical stack). Accordingly, by disposing the VCSEL device over the IC driver chip (e.g., instead of positioning the VCSEL device and the IC driver chip next to each other), the substrate has a reduced size as compared to that of a conventional projector module and, thus, a size (e.g., an XY footprint) of the electro-optical device is reduced as compared to a size of the conventional projector module. This enables the electro-optical device to be included in some user devices, such as smart phones.

The VCSEL device may include a plurality of emitters and a microlens component. The microlens component may be disposed over the plurality of emitters and on a particular surface of the VCSEL device. The microlens component may collimate light emitted by the VCSEL device as the VCSEL device emits light, and therefore a collimating lens and a PD that is configured to detect a failure associated with a collimating lens do not need to be included in the optical assembly. In this way, a size of the optical subassembly is additionally reduced and, thus, a size (e.g., an XY footprint) of the electro-optical device is additionally reduced as compared to a size of a conventional projector module. Foregoing inclusion of the collimating lens also reduces a thickness (e.g., a Z height) of the electro-optical device as compared to a thickness of a conventional projector module.

In some implementations, the VCSEL device may include a cathode contact and an anode contact that are disposed on a particular surface of the VCSEL device (e.g., the same surface as that of the microlens component). In this way, another surface of the VCSEL device, which may electrically insulated, may be directly disposed on the second surface of the substrate. In some implementations, a cavity may be formed in the second surface of the substrate, which may expose the thermally conductive core of the substrate, and therefore the other surface of the VCSEL device may be directly disposed on the thermally conductive core within the cavity formed in the second surface of the substrate. Accordingly, the substrate and/or the thermally conductive core may be configured to thermally conduct heat generated by the VCSEL device (e.g., when emitting light) from the VCSEL device to the IC driver chip. Further, the IC driver chip and one or more attachment materials may be configured to thermally conduct the heat to another substrate (e.g., of a user device). This reduces a number of dielectric layers through which heat generated by the VCSEL device has to pass in the optical assembly. Therefore, the electro-optical device has an improved thermal performance as compared to a conventional projector module, which causes the electro-optical device to have an increased optical power output as compared to the optical power output of the conventional projector module (e.g., due to a lower VCSEL junction temperature associated with the VCSEL device of the electro-optical device).

Figure 1B:
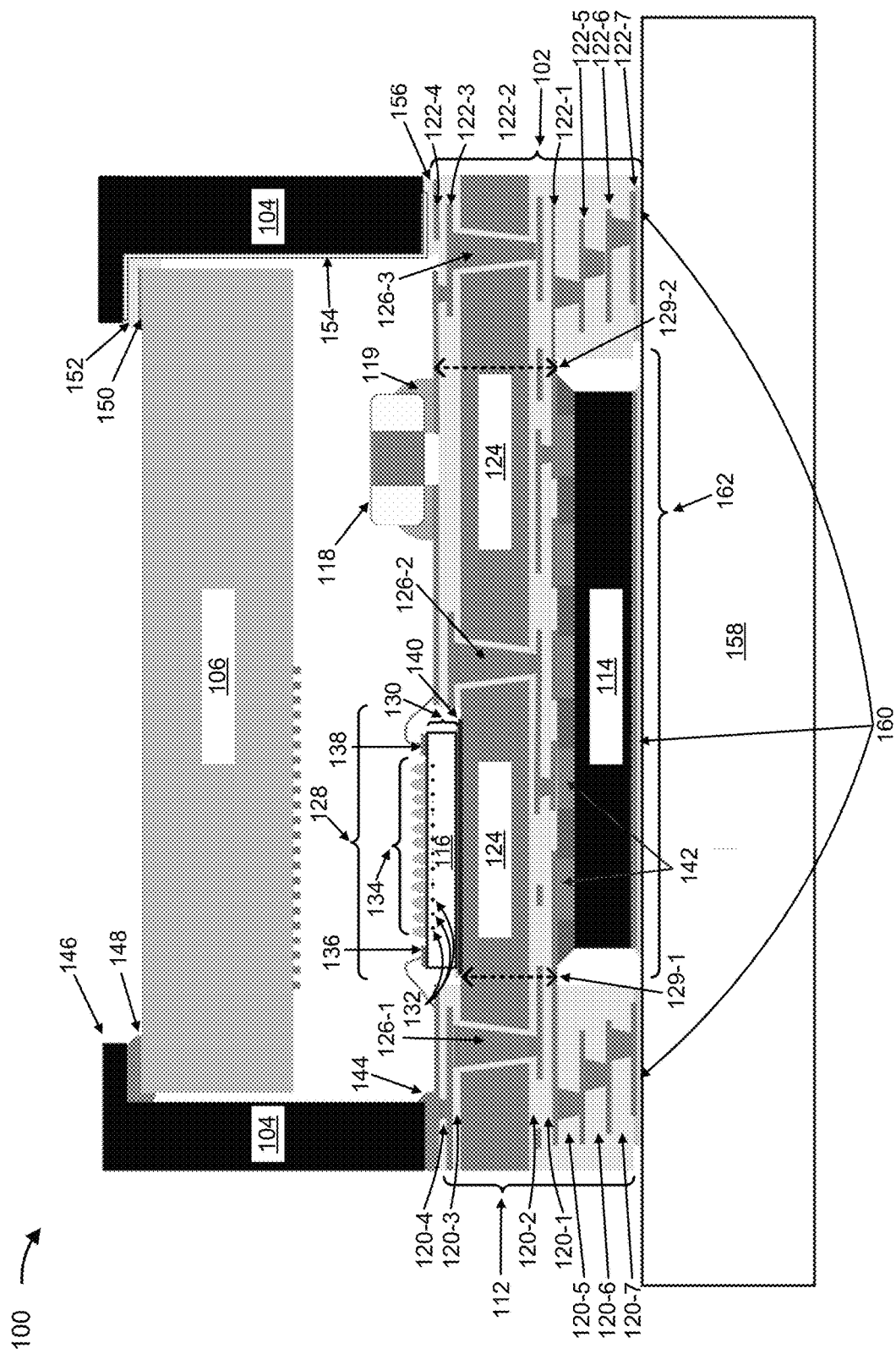
Figure 1C:
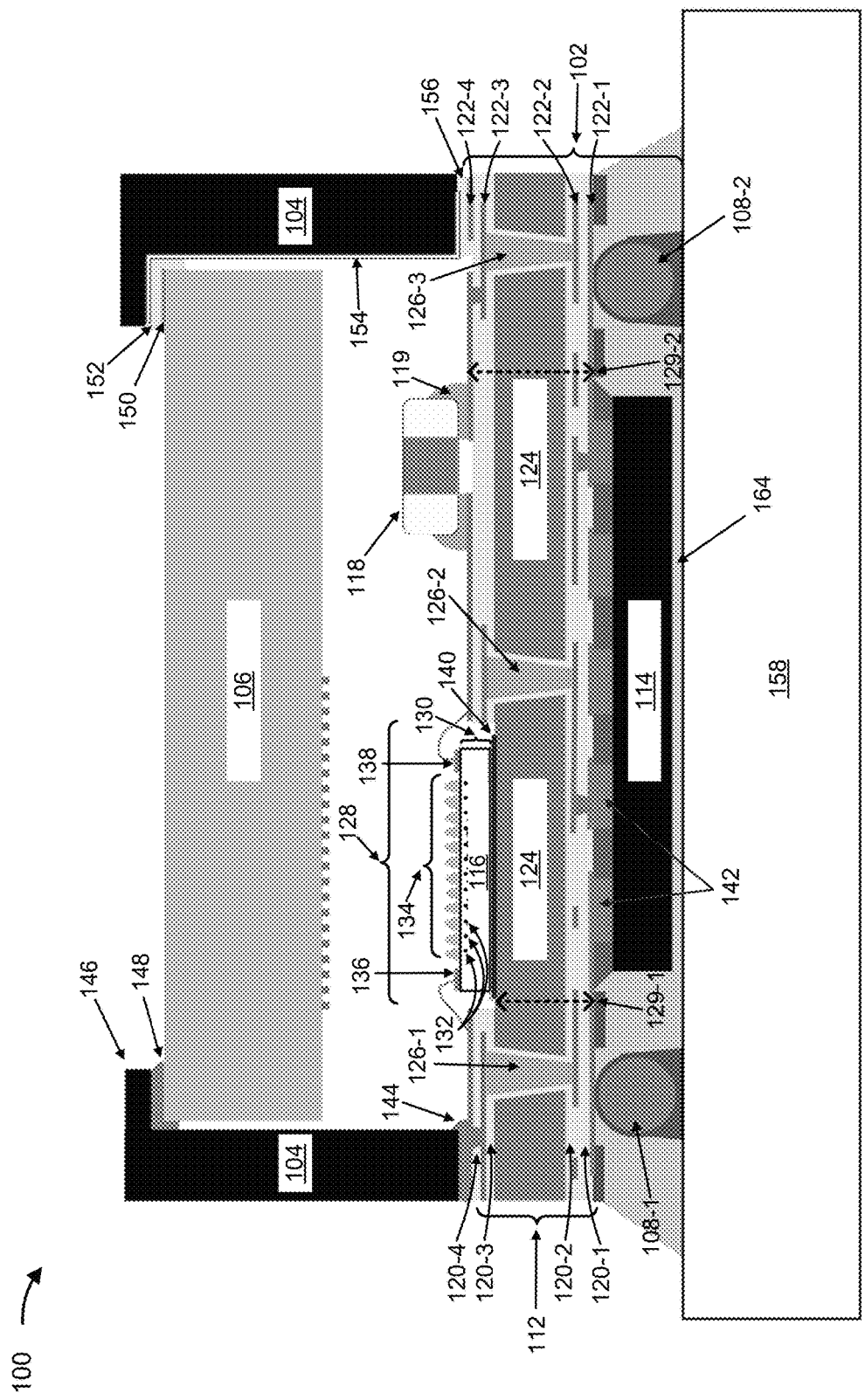

FIGS. 1A-1C are diagrams of an example optical assembly 100 for an electro-optical device, such as a ToF device (e.g., a dot projector (dToF) device or a flood illuminator (iToF) device). FIG. 1A illustrates a side cut-away view of a first configuration of the optical assembly 100. FIG. 1B illustrates a side cut-away view of a second configuration of the optical assembly 100. FIG. 1C illustrates a side cut-away view of a third configuration of the optical assembly 100.

As shown in FIG. 1A, the optical assembly 100 may include an optical subassembly 102, a housing 104, an optical element 106, a first set of attachment structures 108 (e.g., one or more attachment structures 108, shown as attachment structures 108-1 and 108-2), and/or a second set of attachment structures 110 (e.g., one or more attachment structures 110). The optical subassembly 102 may include a substrate 112, an integrated circuit (IC) driver chip 114, a VCSEL device 116, and/or an electrical element 118.

In some implementations, the substrate 112 may include one or more dielectric layers 120 (shown as dielectric layers 120-1 through 120-4 in FIG. 1A), one or more metal layers 122 (shown as metal layers 122-1 through 122-4 in FIG. 1A), a thermally conductive core 124, and/or one or more vias 126 (shown as vias 126-1 through 126-3 in FIG. 1A). Each of the one or more dielectric layers 120 may comprise, for example, an FR4 material, a polyimide material, an epoxy material, an aluminum oxynitride (AlON) material, an aluminum nitride (AlN) material, an aluminum phosphate ($AlPO_4$) material, an aluminum oxide ($Al_2O_3$) material, and/or another dielectric material. Each of the one or more metal layers 122 may comprise, for example, tungsten (W), a W alloy, copper (Cu), a Cu alloy, a CuW alloy, molybdenum (Mo), a Mo alloy, a WMo alloy, silver (Ag), and/or an Ag alloy. The thermally conductive core 124 may comprise, for example, W, a W alloy, Cu, a Cu alloy, a CuW alloy, Mo, a Mo alloy, a WMo alloy, Ag, an Ag alloy, and/or another thermally conductive material. Each of the one or more vias 126 may be filled with, for example, W, a W alloy, Cu, a Cu alloy, a CuW alloy, Mo, a Mo alloy, a WMo alloy, Ag, an Ag alloy, and/or an electrically conductive epoxy (e.g., sintered Ag-epoxy, semi-sintered Ag-epoxy, or Ag-epoxy).

In some implementations, a dielectric layer 120, of the one or more dielectric layers 120, may be disposed between two different metal layers 122 of the one or more metal layers 122. For example, as shown in FIG. 1A, the dielectric layer 120-4 may be disposed between the metal layers 122-3 and 122-4. Additionally, or alternatively, a metal layer 122, of the one or more metal layers 122, may be disposed between two different dielectric layers 120 of the one or more dielectric layers 120. For example, as shown in FIG. 1A, the metal layer 122-2 may be disposed between the dielectric layers 120-1 and 120-2.

In some implementations, the thermally conductive core 124 may be disposed between at least two layers of the one or more dielectric layers 120 and the one or more metal layers 122. For example, as shown in FIG. 1A, the thermally conductive core 124 may be disposed between a first set of layers comprising the dielectric layers 120-1 and 120-2 and the metal layers 122-1 and 122-2, and a second set of layers comprising the dielectric layers 120-3 and 120-4 and the metal layers 122-3 and 122-4. In some implementations, a via 126, of the one or more vias 126, may connect two metal layers 122, of the one or more metal layers 122, to each other (e.g., through an opening in the thermally conductive core 124). Additionally, or alternatively, a via 126, of the one or more vias 126, may connect a metal layer 122 (e.g., that acts a ground metal layer), of the one or more metal layers 122, to the thermally conductive core 124.

As shown in FIG. 1A, the substrate 112 may include a top surface and a bottom surface. In some implementations, the substrate 112 may include a cavity 128 (e.g., that is formed in the top surface of the substrate 112). For example, a portion of at least one of the one or more dielectric layers 120 and/or a portion of at least one of the one or more metal layers 122 may be removed (e.g., using an etch removal process), or may not be formed, to cause the substrate 112 to include the cavity 128. As further shown in FIG. 1A, a thickness 129-1 of a portion of the substrate 112 that is associated with the cavity 128 may be less than a thickness 129-2 of another portion of the substrate 112 that is not associated with the cavity 128. In some implementations, a top surface of the thermally conductive core 124 may be exposed within the cavity 128. Accordingly, a portion of the top surface of the substrate 112 (e.g., that is located within the cavity 128) may include a portion of the top surface of the thermally conductive core 124.

The IC driver chip 114 of the optical subassembly 102 may comprise silicon (Si), indium phosphide (InP), gallium arsenide (GaAs), and/or another similar material (e.g., a thermally conductive material). The IC driver chip 114 may be configured to generate and provide an electrical signal to the VCSEL device 116 (e.g., to cause the VCSEL device 116 to emit an output beam). The VCSEL device 116 may be, for example, a short-wave infrared (SWIR) VCSEL device, an oxide confined VCSEL device, an implant confined VCSEL device, a mesa confined VCSEL device, a top emitting VCSEL device, or a bottom emitting VCSEL device. In some implementations, the VCSEL device 116 may be configured to emit an output beam, such as an output laser beam (e.g., based on the electrical signal provided by the IC driver chip 114). Additionally, or alternatively, the VCSEL device 116 may be a one-dimensional (1D) addressable VCSEL device (e.g., that enables a particular row of emitters, of a plurality of emitters described herein, to emit an output beam) or a two-dimensional (2D) addressable VCSEL device (e.g., that enables a particular emitter, of the plurality of emitters described herein, to emit an output beam).

The VCSEL device 116 may include a substructure 130, a plurality of emitters 132, a microlens component 134, a cathode contact 136, and/or an anode contact 138. The plurality of emitters 132 may be disposed within the substructure 130 of the VCSEL device 116. For example, when the VCSEL device 116 is a top emitting VCSEL device, the plurality of emitters 132 may be disposed within a top portion of the substructure 130 (e.g., so that the plurality of emitters emit the output laser beam from a top surface of the substructure 130). The microlens component 134 may include a plurality of microlenses and may be disposed over the plurality of emitters 132. For example, the microlens component 134 may be disposed over the plurality of emitters 132 (e.g., on the top surface of the substructure 130) such that each emitter 132, of the plurality of emitters 132, emits a portion of the output laser beam via a particular microlens 134 of the microlens component 134.

The cathode contact 136 may be disposed on the top surface of the substructure 130 of the VCSEL device 116 (e.g., disposed on a particular region of the top surface of the substructure 130 of the VCSEL device 116 on which the microlens component 134 and the anode contact 138 are not disposed). The cathode contact 136 may be connected (e.g., electrically connected) to a metal layer 122 of the one or more metal layers 122 of the substrate 112. For example, as shown in FIG. 1A, the cathode contact 136 may be connected to the metal layer 122-4 of the substrate 112 via a wire bond. The anode contact 138 may be disposed on the top surface of the substructure 130 of the VCSEL device 116 (e.g., disposed on a particular region of the top surface of the substructure 130 of the VCSEL device 116 on which the microlens component 134 and the cathode contact 136 are not disposed). The anode contact 138 may be connected (e.g., electrically connected) to a metal layer 122 of the one or more metal layers 122 of the substrate 112. For example, as shown in FIG. 1A, the anode contact 138 may be connected to the metal layer 122-4 of the substrate 112 via a wire bond.

In some implementations, a portion of the VCSEL device 116 may be electrically insulated. For example, at least a bottom surface of the VCSEL device 116 (e.g., that includes a bottom surface of the substructure 130 of the VCSEL device 116) may be electrically insulated. Accordingly, as shown in FIG. 1A, the VCSEL device 116 may be disposed on the substrate 112. For example, the bottom surface of the VCSEL device 116 may be disposed on the top surface of the substrate 112. In a particular example, as shown in FIG. 1A, the bottom surface of the VCSEL device 116 may be disposed on the top surface of the thermally conductive core 124 within the cavity 128 of the substrate 112.

In some implementations, at least one attachment material 140 may be disposed between the substrate 112 and the VCSEL device 116. For example, the at least one attachment material 140 may be disposed between the top surface of the substrate 112 (e.g., the portion of the top surface of the substrate 112 that comprises the top surface of the thermally conductive core 124) and the bottom surface of the VCSEL device 116. The at least one attachment material 140 may be configured to mechanically attach the VCSEL device 116 to the thermally conductive core 124 of the substrate 112. The at least one attachment material 140 may include, for example, a thermally conductive epoxy (e.g., an Ag-epoxy), a solder, or another material.

In some implementations, the IC driver chip 114 may be disposed on the substrate 112. For example, as shown in FIG. 1A, a top surface of the IC driver chip 114 may be disposed on the bottom surface of the substrate 112. The IC driver chip 114 may be disposed on the bottom surface of the substrate 112 such that at least a portion of the IC driver chip 114 and at least a portion of the VCSEL device 116 are respectively disposed on a same portion of the substrate 112 (e.g., at least a portion of the IC driver chip 114 and at least a portion of the VCSEL device 116 are vertically aligned on a portion of the substrate 112). Alternatively, in some implementations, the IC driver chip 114 may be disposed on the bottom surface of the substrate 112 such that the IC driver chip 114 and the VCSEL device 116 are not disposed on a same portion of the substrate 112 (e.g., the IC driver chip 114 and the VCSEL device 116 are not vertically aligned on a portion of the substrate 112). In some implementations, at least one attachment material 142 may be disposed between the IC driver chip 114 and the substrate 112. The at least one attachment material 142 may be configured to mechanically attach the IC driver chip 114 to the substrate 112. The at least one attachment material 142 may include, for example, a thermally conductive epoxy (e.g., an Ag-epoxy), a solder, or another material. Additionally, or alternatively, the at least one attachment material 142 may include an underfill material.

In some implementations, as shown in FIG. 1A, the electrical element 118 may be disposed on the top surface of the substrate 112. The electrical element 118 may be a capacitor, such as an equivalent series inductance (ESL) capacitor, a photodiode (PD), or another type of electrical element. In some implementations, the electrical element 118 may be electrically and/or mechanically connected to the top surface of the substrate 112 via an attachment material 119, such as an epoxy (e.g., silver-epoxy (Ag-epoxy), sintered Ag-epoxy, or semi-sintered Ag-epoxy), a solder, and/or a similar material.

In some implementations, the housing 104 of the optical assembly 100 may comprise a polymer material, a plastic material, a metallic material, and/or a similar material and may be disposed on the optical subassembly 102. For example, as shown in FIG. 1A, the housing 104 may be disposed on at least a portion of a perimeter region of the substrate 112 of the optical subassembly 102. In some implementations, at least a portion of the housing 104 may be mechanically connected to the substrate 112 via an attachment material 144, such as an epoxy, a solder, and/or a similar material.

In some implementations, the housing 104 may include at least one support component 146 that is configured to hold the optical element 106. For example, as shown in FIG. 1A, the housing 104 may include at least one support component 146 that comprises a bottom surface of a "cantilever" or a "ledge" on which the optical element 106 is disposed. The optical element 106 of the optical assembly 100 may include a diffractive optical element (DOE) (e.g., when the optical assembly 100 is included in a dToF device) and/or a diffuser (e.g., when the optical assembly 100 is included in an iToF device) and may comprise a glass material. In some implementations, the optical element 106 may be mechanically connected to the at least one support component 146 via an attachment material 148, such as an epoxy, a solder, and/or a similar material.

In some implementations, the housing 104 may include a conductive path 150 associated with the optical element 106 (e.g., to facilitate detection of damage to the optical element 106). The conductive path 150 may comprise, for example, indium tin oxide (ITO). As further shown in FIG. 1A, an attachment material 152 may be configured to mechanically connect the conductive path 150 and/or the optical element 106 to the housing 104. Additionally, or alternatively, the attachment material 152 may be configured to electrically connect the conductive path 150 to a conductive trace 154, which may be disposed on a surface of the housing 104. For example, the attachment material 152 may include an epoxy (e.g., sintered Ag-epoxy, semi-sintered Ag-epoxy, or Ag-epoxy), a solder, and/or a similar material. The conductive trace 154 may comprise a metal, such as Cu, nickel (Ni), and/or gold (Au), among other examples.

As further shown in FIG. 1A, an attachment material 156 may be configured to mechanically connect the conductive trace 154 to the substrate 112 of the optical subassembly 102. Additionally, or alternatively, the attachment material 156 may be configured to electrically connect the conductive trace 154 to the substrate 112. For example, the attachment material 156 may include an epoxy (e.g., sintered Ag-epoxy, semi-sintered Ag-epoxy, or Ag-epoxy), a solder, and/or a similar material. Accordingly, the conductive trace 154 may be configured to provide an electrical connection between the optical subassembly 102 (e.g., via the substrate 112) and the conductive path 150 (e.g., via the attachment material 152 and the attachment material 156).

In some implementations, the optical assembly 100 may be configured to be disposed on a surface of a user device substrate 158 (e.g., a substrate, such as printed circuit board (PCB), of a user device, such as a smart phone). For example, as shown in FIG. 1A, a bottom surface of the optical assembly 100 (e.g., that comprises one or more portions of a bottom surface of the substrate 112 of the optical subassembly 102 and/or a bottom surface of the IC driver chip 114) may be configured to be disposed on a top surface of the user device substrate 158.

The first set of attachment structures 108 and/or the second set of attachment structures 110 of the optical assembly 100 may be configured to mechanically connect the optical subassembly 102 of the optical assembly 100 to the user device substrate 158. For example, as shown in FIG. 1A, the first set of attachment structures 108 (e.g., the attachment structures 108-1 and 108-2) may be configured to mechanically connect one or more portions of the bottom surface of the substrate 112 of the optical subassembly 102 to the top surface of the user device substrate 158, and/or the second set of attachment structures 110 may be configured to mechanically connect the bottom surface of the IC driver chip 114 of the optical subassembly 102 to the top surface of the user device substrate 158. In some implementations, an attachment structure 108 of the first set of attachment structures 108 may comprise a solder ball (e.g., the attachment structure 108-1 shown in FIG. 1A), a column (e.g., the attachment structure 108-2 shown in FIG. 1A), or a differently shaped structure, and may have a thermally conductive core that comprises, for example, W, a W alloy, Cu, a Cu alloy, a CuW alloy, Mo, a Mo alloy, a WMo alloy, Ag, an Ag alloy, and/or another thermally conductive material. An attachment structure 110 of the second set of attachment structures 110 may include a thermally conductive epoxy that is configured to mechanically connect a bottom portion of the optical subassembly 102 (e.g., that comprises the bottom surface of the IC driver chip 114 of the optical subassembly 102) to the top surface of the user device substrate. The thermally conductive epoxy may be configured to cure during a solder reflow process associated with forming the first set of the one or more attachment structures 110 (e.g., the thermally conductive epoxy may cure within a temperature range associated with a solder reflow process).

In some implementations, in the first configuration of the optical assembly 100, as shown in FIG. 1A, the IC driver chip 114 of the optical subassembly may generate and provide an electrical signal to the VCSEL device 116 (e.g., through the at least one attachment material 142 and the one or more metal layers 122 of the substrate 112), which causes the VCSEL device 116 to emit an output beam. This also causes the VCSEL device 116 to generate heat (e.g., as an additional result of emitting the output beam). In some implementations, the at least one attachment material 140 may be configured to thermally conduct the heat (e.g., in a vertical direction) from the VCSEL device 116 to the substrate 112 (e.g., to the thermally conductive core 124). The thermally conductive core 124 may be configured to thermally conduct the heat within the thermally conductive core 124, such as in a horizontal direction, and/or to thermally conduct the heat from the top surface of the substrate 112 (e.g., a portion of the top surface of the substrate 112 that is located within the cavity 128 and that includes a portion of the top surface of the thermally conductive core 124) to the bottom surface of the substrate 112 (e.g., a portion of the bottom surface of the substrate 112 that is associated with the cavity 128), such as in a vertical direction. In this way, the thermally conductive core 124 may be configured to thermally conduct the heat in multiple directions.

In some implementations, the at least one attachment material 142 may be configured to thermally conduct the heat (e.g., in a vertical direction) from the substrate 112 to the IC driver chip 114 (e.g., from the bottom surface of the substrate 112 to the top surface of the IC driver chip 114). The IC driver chip 114 may be configured to thermally conduct the heat (e.g., in a vertical direction) from the top surface of the IC driver chip 114 to the bottom surface of the IC driver chip 114. The second set of attachment structures 110 may be configured to thermally conduct the heat (e.g., in a vertical direction) from the IC driver chip 114 to the user device substrate 158 (e.g., from the bottom surface of the IC driver chip 114 to the user device substrate 158). In this way, the heat may be dissipated by the optical subassembly 102 of the optical assembly 100 (e.g., by conducting the heat away from the VCSEL device 116 to the user device substrate 158).

In the second configuration of the optical assembly 100, as shown in FIG. 1B, the optical assembly 100 may include the optical subassembly 102, the housing 104, and/or the optical element 106 configured in a similar manner as described herein in relation to FIG. 1A. As shown in FIG. 1B, one or more portions of the substrate 112 of the optical subassembly 102 may include one or more additional dielectric layers 120 and/or one or more additional metal layers 122 (e.g., within one or more portions of the substrate 112). For example, as shown in FIG. 1B, one or more outer portions of the substrate 112 of the optical subassembly 102 may include additional dielectric layers 120-5 through 120-7 and additional metal layers 122-5 through 122-7. In this way, the optical assembly 100 may not include the first set of attachment structures 108 (e.g., to connect the substrate 112 to the user device substrate 158) and/or the second set of attachment structures 110 (e.g., to connect the IC driver chip 114 to the user device substrate 158).

Accordingly, the optical assembly 100 may include a third set of attachment structures 160 (e.g., one or more attachment structures 160) that are configured to mechanically connect the optical subassembly 102 of the optical assembly 100 to the user device substrate 158. For example, as shown in FIG. 1B, the third set of attachment structures 160 may be configured to mechanically connect one or more portions of the bottom surface of the substrate 112 of the optical subassembly 102 to the top surface of the user device substrate 158 and/or a portion of the bottom surface of the IC driver chip 114 to the top surface of the user device substrate 158. An attachment structure 160 of the third set of attachment structures 160 may include an epoxy, a solder, and/or a similar material.

As further shown in FIG. 1B, when one or more outer portions of the substrate 112 of the optical subassembly 102 include additional dielectric layers 120 and/or additional metal layers 122, the substrate 112 may include an additional cavity 162 (e.g., that is formed in the bottom surface of the substrate 112). Accordingly, in some implementations, the IC driver chip 114 may be disposed on a region of the bottom surface of the substrate 112 that is within the additional cavity 162 of the substrate 112. For example, as shown in FIG. 1B, the top surface of the IC driver chip 114 may be disposed on the bottom surface of the substrate 112 within the additional cavity 162 of the substrate 112.

In some implementations, in the second configuration of the optical assembly 100, as shown in FIG. 1B, the heat generated by the VCSEL device 116 may be thermally conducted by the optical subassembly 102 to the IC driver chip 114 (e.g., in a similar manner as that described herein in relation to FIG. 1A). The third set of attachment structures 160 may be configured to thermally conduct the heat (e.g., in a vertical direction) from the IC driver chip 114 to the user device substrate 158 (e.g., from the bottom surface of the IC driver chip 114 to the user device substrate 158). In this way, the heat may be dissipated by the optical subassembly 102 of the optical assembly 100 (e.g., by conducting the heat away from the VCSEL device 116 to the user device substrate 158).

In the third configuration of the optical assembly 100, as shown in FIG. 1C, the optical assembly 100 may include the optical subassembly 102, the housing 104, and/or the optical element 106 configured in a similar manner as described herein in relation to FIG. 1A. As shown in FIG. 1C, the optical assembly 100 may include a fourth set of attachment structures 164 (e.g., one or more attachment structures 164) that are configured to mechanically connect the optical subassembly 102 of the optical assembly 100 to the user device substrate 158. For example, as shown in FIG. 1C, the fourth set of attachment structures 164 may be configured to mechanically connect one or more portions of the bottom surface of the substrate 112 of the optical subassembly 102 and/or the bottom surface of the IC driver chip 114 to the top surface of the user device substrate 158. An attachment structure 164 of the fourth set of attachment structures 164 may include an underfill material. In this way, the optical assembly 100 may not include the first set of attachment structures 108 (e.g., to connect the substrate 112 to the user device substrate 158) and/or the second set of attachment structures 110 (e.g., to connect the IC driver chip 114 to the user device substrate 158).

In some implementations, in the third configuration of the optical assembly 100, as shown in FIG. 1C, the heat generated by the VCSEL device 116 may be thermally conducted by the optical subassembly 102 to the IC driver chip 114 (e.g., in a similar manner as that described herein in relation to FIG. 1A). The fourth set of attachment structures 164 may be configured to thermally conduct the heat (e.g., in a vertical direction) from the IC driver chip 114 to the user device substrate 158 (e.g., from the bottom surface of the IC driver chip 114 to the user device substrate 158). In this way, the heat may be dissipated by the optical subassembly 102 of the optical assembly 100 (e.g., by conducting the heat away from the VCSEL device 116 to the user device substrate 158).

As indicated above, FIGS. 1A-1C are provided as an example. Other examples may differ from what is described with regard to FIGS. 1A-1C. In practice, the optical assembly 100 may include additional layers and/or elements, fewer layers and/or elements, different layers and/or elements, or differently arranged layers and/or elements than those shown in FIGS. 1A-1C.

Figure 2:
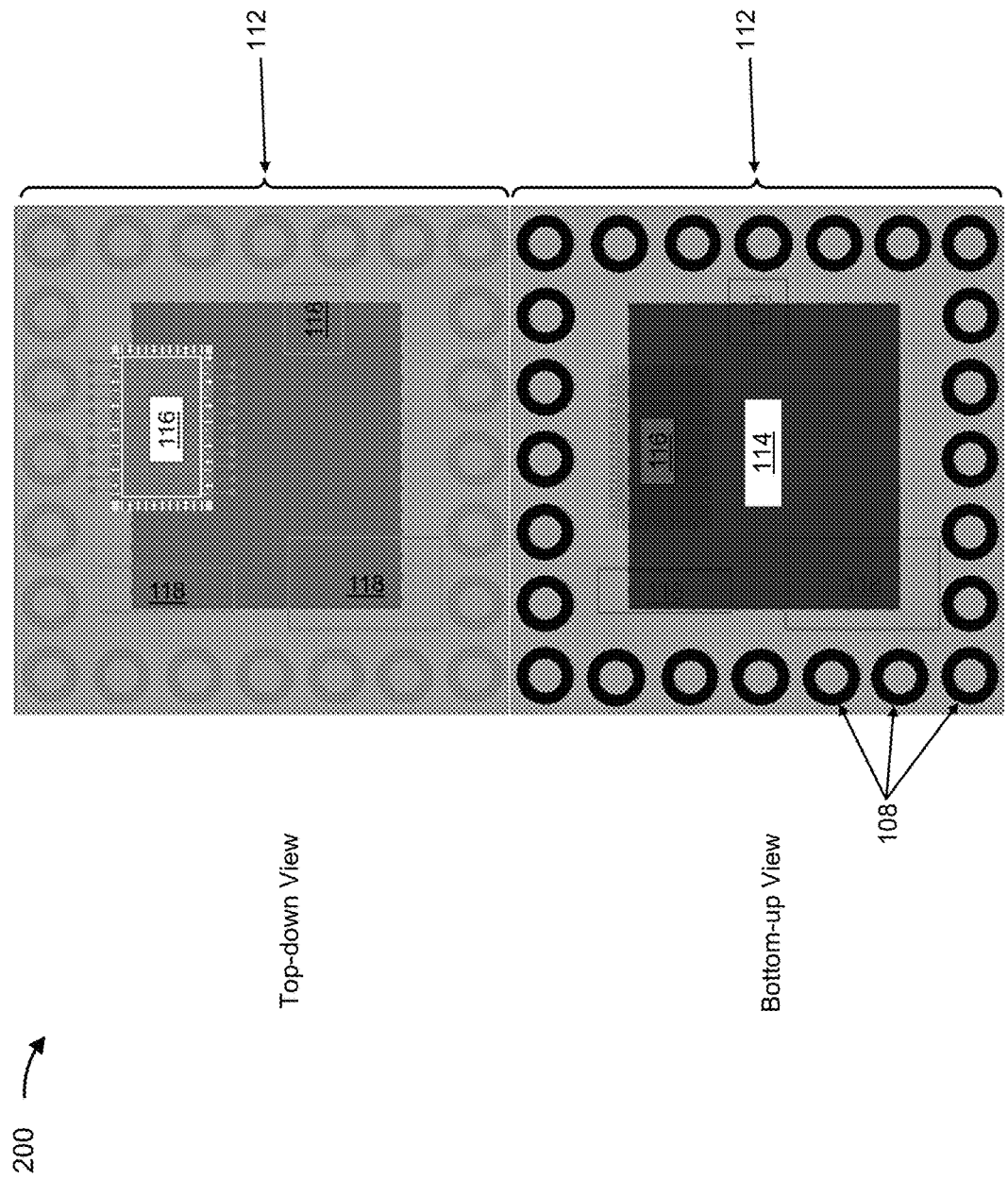
FIG. 2 is a diagram of an example optical subassembly described herein.

FIG. 2 illustrates top-down and bottom-up views 200 of the optical subassembly 102. As shown in FIG. 2, the VCSEL device 116 and a plurality of electrical elements 118 may be disposed on the top surface of the substrate 112. As further shown in FIG. 2, the IC driver chip 114 and the first set of attachment structures 108 may be disposed on the bottom surface of the substrate 112.

As indicated above, FIG. 2 is provided as an example. Other examples may differ from what is described with regard to FIG. 2. In practice, the optical subassembly 102 may include additional layers and/or elements, fewer layers and/or elements, different layers and/or elements, or differently arranged layers and/or elements than those shown in FIG. 2.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical assembly, comprising:
    a substrate;
    an integrated circuit (IC) driver chip that is disposed on a first surface of the substrate; and
    a vertical cavity surface emitting laser (VCSEL) device that is disposed on a second surface of the substrate, wherein:
        the first surface is opposite the second surface,
        at least a portion of the IC driver chip and at least a portion of the VCSEL device are vertically aligned on a same portion of the substrate, and
        the VCSEL device includes:
            a substructure,
            a plurality of emitters disposed within the substructure of the VCSEL device,
            a microlens component disposed over the plurality of emitters and on a top surface of the substructure of the VCSEL device,
            a cathode contact disposed on the top surface of the substructure of the VCSEL device, and
            an anode contact disposed on the top surface of the substructure of the VCSEL device.

2. The optical assembly of claim 1, wherein the VCSEL device comprises:
    a short-wave infrared (SWIR) VCSEL device;
    an oxide confined VCSEL device;
    an implant confined VCSEL device;
    a mesa confined VCSEL device; or
    a top emitting VCSEL device.

3. The optical assembly of claim 1, wherein the substrate comprises:
    one or more dielectric layers;
    one or more metal layers; and
    a thermally conductive core.

4. The optical assembly of claim 1, wherein the substrate includes a thermally conductive core that comprises at least one of:
    tungsten (W);
    a W alloy;
    copper (Cu);
    a Cu alloy;
    a CuW alloy;
    molybdenum (Mo);
    a Mo alloy;
    a WMo alloy;
    silver (Ag); or
    an Ag alloy.

5. The optical assembly of claim 1, wherein the substrate is configured to thermally conduct heat generated by the VCSEL device from the VCSEL device to the IC driver chip.

6. The optical assembly of claim 1, wherein the substrate includes a cavity formed in the first surface of the substrate, and
    wherein the IC driver chip is disposed on a region of the first surface of the substrate that is within the cavity.

7. The optical assembly of claim 1, wherein the substrate includes a cavity formed in the second surface of the substrate, and
    wherein the VCSEL device is disposed on a region of the second surface of the substrate that is within the cavity.

8. The optical assembly of claim 1, wherein a surface of the VCSEL device is disposed on a thermally conductive core of the substrate within a cavity formed in the second surface of the substrate, and
    wherein the surface of the VCSEL device is electrically insulated.

9. An optical assembly, comprising:
    a substrate that includes a thermally conductive core;
    an integrated circuit (IC) driver chip that is disposed on a first surface of the substrate; and
    a vertical cavity surface emitting laser (VCSEL) device that is disposed on a second surface of the substrate, wherein:
        the first surface is opposite the second surface, and
        the VCSEL device includes:
            a cathode contact disposed on a surface of the VCSEL device, and
            an anode contact disposed on the surface of the VCSEL device.

10. The optical assembly of claim 9, wherein at least a portion of the IC driver chip and at least a portion of the VCSEL device are respectively disposed on a same portion of the substrate.

11. The optical assembly of claim 9, wherein the VCSEL device includes an electrically insulated surface, and
    wherein the electrically insulated surface of the VCSEL device is disposed on the thermally conductive core of the substrate within a cavity formed in the second surface of the substrate.

12. The optical assembly of claim 9, wherein the thermally conductive core of the substrate is configured to thermally conduct heat generated by the VCSEL device in a first direction from the first surface of the substrate to the second surface of the substrate and in a second direction within the thermally conductive core.

13. The optical assembly of claim 9, further comprising one or more attachment structures, wherein:

the one or more attachment structures each have a thermally conductive core; and the one or more attachment structures are configured to connect one or more portions of the substrate to a surface of another substrate.

14. The optical assembly of claim 9, further comprising a thermally conductive epoxy that is configured to mechanically connect a surface of the IC driver chip to a surface of another substrate.

15. The optical assembly of claim 9, further comprising an underfill material that is configured to mechanically connect a surface of another substrate to at least one of:

one or more portions of the substrate; or a surface of the IC driver chip.

16. The optical assembly of claim 9, further comprising a solder that is configured to mechanically connect a surface of another substrate to at least one of:

one or more portions of the substrate; or a surface of the IC driver chip.

17. An optical assembly, comprising:

a substrate that includes a thermally conductive core;

an integrated circuit (IC) driver chip that is disposed on a first surface of the substrate; and a vertical cavity surface emitting laser (VCSEL) device that includes an electrically insulated surface that is disposed on the thermally conductive core of the substrate within a cavity formed in a second surface of the substrate, wherein the first surface is opposite the second surface.

18. The optical assembly of claim 17, further comprising a housing and an optical element, wherein:

the optical element is held by at least one support component of the housing via an attachment material.

19. The optical assembly of claim 17, wherein the VCSEL device includes a cathode contact and an anode contact, wherein:

the cathode contact is disposed on another surface of the VCSEL device; and the anode contact is disposed on the other surface of the VCSEL device.

20. The optical assembly of claim 19, wherein the VCSEL device includes a microlens component that is disposed on the other surface of the VCSEL device.

* * * * *